(12) United States Patent
Howland, Jr. et al.

(10) Patent No.: US 7,304,490 B2
(45) Date of Patent: Dec. 4, 2007

(54) IN-SITU WAFER AND PROBE DESORPTION USING CLOSED LOOP HEATING

(75) Inventors: William H. Howland, Jr., Wexford, PA (US); Brian R. Bobrzynski, Pittsburgh, PA (US)

(73) Assignee: Solid State Measurements, Inc., Pittsburgh, PA (US)

( * ) Notice: Subject to any disclaimer, the term of this patent is extended or adjusted under 35 U.S.C. 154(b) by 1 day.

(21) Appl. No.: 10/982,344

(22) Filed: Nov. 5, 2004

(65) Prior Publication Data

US 2006/0097740 A1    May 11, 2006

(51) Int. Cl.
G01R 31/02    (2006.01)
(52) U.S. Cl. .................... 324/760; 324/761
(58) Field of Classification Search ........ 324/754–765, 324/158.1, 671; 165/201, 253
See application file for complete search history.

(56) References Cited

U.S. PATENT DOCUMENTS

| | | | |
|---|---|---|---|
| 4,787,752 A | * | 11/1988 | Fraser et al. .................. 374/45 |
| 5,325,052 A | * | 6/1994 | Yamashita ................... 324/754 |
| 5,770,263 A | * | 6/1998 | Hawthorne et al. ......... 427/309 |
| 5,909,123 A | * | 6/1999 | Budnaitis ..................... 324/760 |
| 5,966,593 A | * | 10/1999 | Budnaitis et al. ........... 438/118 |
| 6,124,725 A | * | 9/2000 | Sato ........................... 324/765 |
| 6,492,827 B1 | * | 12/2002 | Mazur et al. ................ 324/761 |
| 6,583,638 B2 | * | 6/2003 | Costello et al. ............. 324/760 |
| 2004/0130718 A1 | | 7/2004 | Krishnan |

* cited by examiner

*Primary Examiner*—Ha Tran Nguyen
*Assistant Examiner*—Arleen M. Vazquez
(74) *Attorney, Agent, or Firm*—The Webb Law Firm

(57) ABSTRACT

A semiconductor wafer is tested by heating an electrical contact to a temperature sufficient to desorb water vapor and/or organic material from a surface thereof. The semiconductor wafer is also heated to a temperature sufficient to desorb water vapor and/or organic material from a top surface thereof. The heated surface of the contact is caused to touch the heated top surface of the semiconductor wafer. An electrical stimulus is applied between the heated surface of the contact and the heated top surface of the semiconductor wafer when the surface of the contact is touching the top surface of the semiconductor wafer. A response of the semiconductor wafer to the applied electrical stimulus is measured and at least one electrical property of the semiconductor wafer is determined from the measured response.

19 Claims, 4 Drawing Sheets

IN-SITU WAFER AND PROBE DESORPTION USING CLOSED LOOP HEATING

BACKGROUND OF THE INVENTION

1. Field of the Invention

The present invention relates to semiconductor wafer testing and, more particularly, to testing of semiconductor wafers in a manner in which the effect of undesirable surface contamination on such testing can be avoided.

2. Description of Related Art

Currently, contact or probe-based capacitance-voltage (CV) and current-voltage (IV) measurement tools and optically based ellipsometry measurement tools are utilized to measure semiconductor wafers that have been desorbed of water vapor, organic material and/or inorganic material prior to conducting such measurements. Each semiconductor wafer is desorbed by heating the wafer or the surface thereof. However, upon cooling, re-absorption of water vapor and organic material can occur at a very rapid rate. Often, by the time the measurement is made, a significant quantity of water vapor and organic material is re-absorbed.

It would, therefore, be desirable to avoid this re-absorption before and during measurement of the electrical properties of each semiconductor wafer, especially measurement by means of CV and/or IV contact or probe-based tools.

SUMMARY OF THE INVENTION

The invention is a method of testing a semiconductor wafer. The method includes (a) heating an electrical contact to a temperature sufficient to desorb at least one of water vapor and organic material from a surface thereof; (b) heating the semiconductor wafer to a temperature sufficient to desorb at least one of water vapor and organic material from a top surface thereof; (c) causing the surface of the contact to touch the top surface of the semiconductor wafer; (d) applying an electrical stimulus between the contact and the semiconductor wafer when the surface of the contact is touching the top surface of the semiconductor wafer; (e) measuring a response of the semiconductor wafer to the electrical stimulus; and (f) determining from the response at least one electrical property of the semiconductor wafer.

The method can further include controlling the heat applied to the electrical contact as a function of the temperature of the electrical contact. The heat applied to the semiconductor wafer can also be controlled as a function of the temperature of the semiconductor wafer or a temperature related to the temperature of the semiconductor wafer.

Step (b) can include heating a wafer chuck having a back surface of the semiconductor wafer positioned thereon.

Step (a) can include supplying an electrical current to a resistive heating element that is operative for heating the electrical contact. The method can further include terminating the supply of electrical current to the resistive heating element during at least one of step (d) and step (e).

Step (b) can include supplying an electrical current to a resistive heating element that is operative for heating the semiconductor wafer. The method can further include terminating the supply of electrical current to the resistive heating element during at least one of step (d) and step (e).

The surface of the electrical contact and the top surface of the semiconductor wafer can either be at the same temperature or within a predetermined temperature difference prior to step (c) and during at least one of step (d) and step (e). The temperature sufficient to desorb in each of step (a) and step (b) is desirably no less than 100 degrees centigrade (100° C.).

The invention is also a semiconductor wafer testing apparatus that includes a first heater for heating an electrical contact to a first temperature sufficient to desorb at least one of water vapor and organic material from a surface thereof and a second heater for heating a top surface of the semiconductor wafer to a second temperature sufficient to desorb at least one of water vapor and organic material therefrom when the back surface of the semiconductor wafer is supported by a wafer chuck. The apparatus also includes means for causing the surface of the electrical contact to touch the top surface of the semiconductor wafer and means for applying an electrical stimulus between the contact and the semiconductor wafer when the surface of the contact is touching the top surface of the semiconductor wafer. A means for measuring measures a response of the semiconductor wafer to the applied electrical stimulus and a means for determining determines from the measured response at least one electrical property of the semiconductor wafer.

The apparatus can further include a first temperature sensor for sensing the first temperature, a second temperature sensor for sensing the second temperature or a temperature related thereto, and a temperature controller for controlling the first and second heaters as a function of the temperatures sensed by the first and second temperature sensors.

The (i) first temperature and the (ii) second temperature or the temperature related thereto are the same temperature or within a predetermined temperature difference prior to the surface of the contact touching the top surface of the semiconductor wafer, and during application of the electrical stimulus by the means for applying the electrical stimulus or during measurement of the response of the semiconductor wafer to the electrical stimulus by the means for measuring the response of the semiconductor wafer.

The first heater heats the electrical contact by at least one of conduction, convection and radiation. The second heater heats the top surface of the semiconductor wafer by at least one of conduction, convection and radiation.

The first heater comprises one of a resistive heating element disposed in an aperture of the electrical contact, a resistive wire coiled around the electrical contact, a fluid heater for supplying a heated fluid to the electrical contact, and a heat lamp for heating the electrical contact. The second heater comprises one of a resistive foil coupled in thermal communication with the wafer chuck, a resistive wire disposed in the wafer chuck, a fluid heater for supplying a heated fluid to the wafer chuck, and a heat lamp for heating the wafer chuck. Desirably, the heated fluid is a gas.

A dielectric can be disposed between the electrical contact and the resistive heating element or the coiled resistive wire. A dielectric can be disposed between the wafer chuck and the resistive foil or the resistive wire disposed in the wafer chuck.

Lastly, the invention is a semiconductor wafer testing apparatus that includes means for heating an electrical contact to a temperature sufficient to desorb at least one of water vapor and organic material from a surface thereof; means for heating the semiconductor wafer to a temperature sufficient to desorb at least one of water vapor and organic material from a top surface thereof; means for causing the surface of the contact to touch the top surface of the semiconductor wafer; means for applying an electrical stimulus between the contact and the semiconductor wafer when the surface of the contact is touching the top surface of the semiconductor wafer; means for measuring a response of the semiconductor wafer to the electrical stimulus; and means for determining from the response at least one electrical property of the semiconductor wafer.

The apparatus can further include means for controlling the heat applied to the electrical contact as a function of the temperature of the electrical contact and means for controlling the heat applied to the semiconductor wafer as a function of the temperature of the semiconductor wafer or a temperature related to the temperature of the semiconductor wafer.

The apparatus can further include means for supporting a back surface of a semiconductor wafer, wherein the means for heating the semiconductor wafer heats the means for supporting the back surface of the semiconductor wafer which conducts said heat to the top surface of the semiconductor wafer via the back surface thereof.

The means for heating the electrical contact can be responsive to an electrical current supplied thereto for heating the electrical contact. During application of the electrical stimulus or during measurement of the response of the semiconductor wafer to the electrical stimulus, the supply of the electrical current to the means for heating the electrical contact can be suspended.

The means for heating the semiconductor wafer can be responsive to an electrical current supplied thereto for heating the semiconductor wafer. During application of the electrical stimulus or during measurement of the response of the semiconductor wafer to the electrical stimulus, the supply of the electrical current to the means for heating the semiconductor wafer can be suspended.

Desirably, the surface of the electrical contact and the top surface of the semiconductor wafer are either at the same temperature or within a predetermined temperature difference prior to the surface of the electrical contact touching the top surface of the semiconductor wafer and during application of the electrical stimulus or during measurement of the response of the semiconductor wafer to the applied electrical stimulus.

Desirably, the temperature sufficient to desorb at least one of water vapor and organic material from the surface of the electrical contact and the top surface of the semiconductor wafer is no less than 100 degrees centigrade (100° C.).

DETAILED DESCRIPTION OF THE INVENTION

The present invention will be described with reference to the accompanying figures where like reference numbers correspond to like elements.

Figure 1:
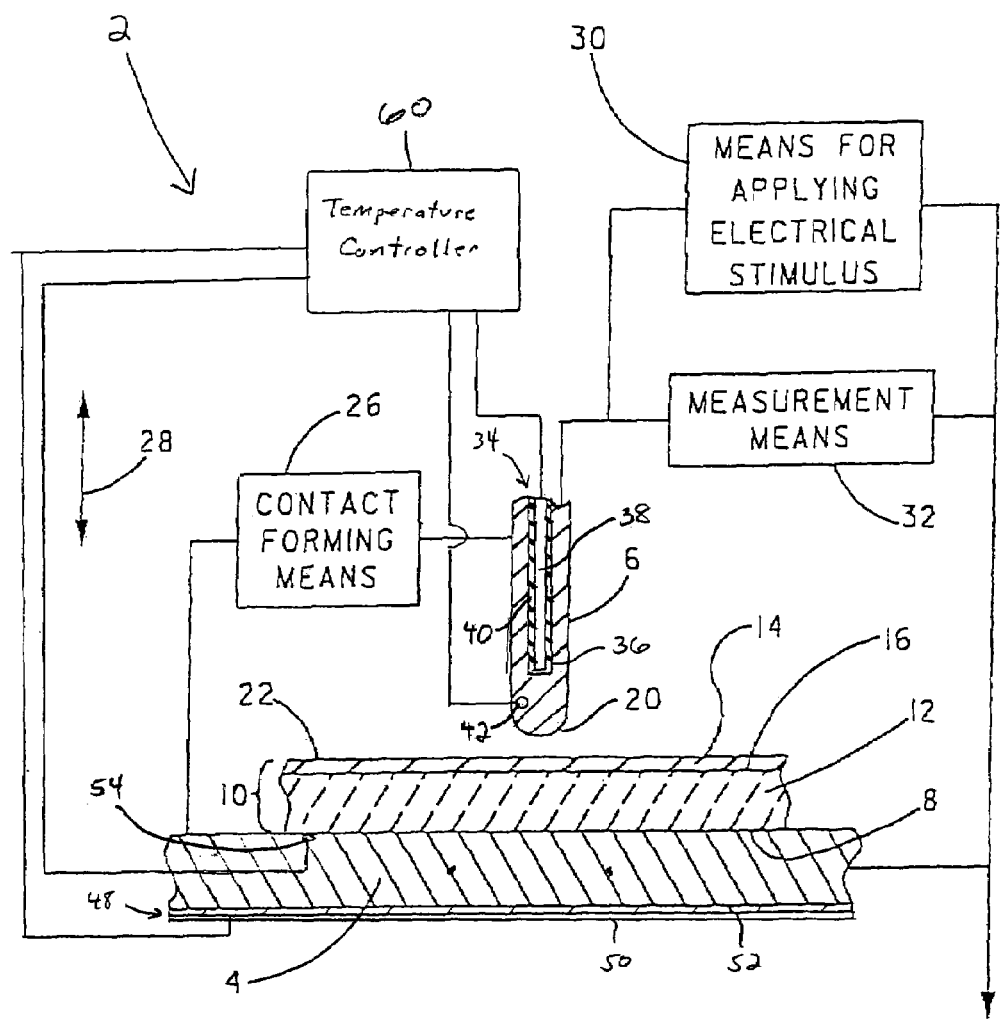
FIGS. 1-4 are combined cross-sectional and block diagram views of semiconductor wafer test systems showing various embodiments of means for heating a contact and/or means for heating a semiconductor wafer under test.

With reference to FIG. 1, a semiconductor wafer test system 2 includes an electrically conductive wafer chuck 4 and contact 6. The illustration in FIG. 1 of contact 6 in the form of an elongated probe is not to be construed as limiting the invention since it is envisioned that contact 6 can have any shape or form suitable for testing a semiconductor wafer 10.

Chuck 4 is configured to support a backside (or back surface) 8 of semiconductor wafer 10 which includes a substrate 12 formed of semiconducting material which is held in contact with chuck 4 by means of a vacuum (not shown). Semiconductor wafer 10 can, but does not necessarily, include a dielectric layer 14 overlaying a topside 16 of substrate 12.

Desirably, contact 6 includes at least a partially spherical and conductive surface 20 for contacting topside (or top surface) 16 of substrate 12 or a topside (or top surface) 22 of dielectric layer 14 when present. While a partially spherical and conductive surface 20 is desired, it is envisioned that surfaces (not shown) having other shapes suitable for testing semiconductor wafer 10 can be utilized. Accordingly, the illustration in FIG. 1 of surface 20 being partially spherical is not to be construed as limiting the invention.

A contact forming means 26, of the type well known in the art, controls the vertical movement of chuck 4 and/or contact 6, in one or both of the directions shown by arrow 28, to move contact 6 and semiconductor wafer 10 toward each other whereupon surface 20 of contact 6 presses into contact with topside 16 of substrate 12 or topside 22 of dielectric layer 14 when present.

A means for applying electrical stimulus 30 can be electrically connected to apply a suitable electrical stimulus to surface 20 and semiconductor wafer 10 when it is received on chuck 4 and surface 20 of contact 6 presses into contact with topside 16 of substrate 12 or topside 22 of dielectric layer 14 when present.

A measurement means 32 can be electrically connected for measuring the response of semiconductor wafer 10 to the test stimulus applied by the means for applying electrical stimulus 30. Desirably, chuck 4 is connected to a reference ground. However, this is not to be construed as limiting the invention since chuck 4 alternatively can be connected to a suitable AC or DC reference bias.

A resistive heating system 34 includes a resistive heating element 38 disposed in an aperture 36 of contact 6. If an interior surface of aperture 36 and an exterior surface of resistive heating element are both electrically conductive, a dielectric sleeve 40 can be positioned in aperture 36 between resistive heating element 38 and the interior surface of aperture 36 to avoid electrical contact therebetween. However, if one or both of the interior surface of aperture 36 and the exterior surface of resistive heating element 38 is a dielectric, dielectric sleeve 40 can be omitted if desired. A temperature sensor 42 can also be disposed inside contact 6 or on a surface thereof, especially on or adjacent surface 20 of contact 6. When temperature sensor 42 and the inside of contact 6 are electrically conductive, a dielectric material can be disposed around temperature sensor 42 to electrically isolate it from contact 6. However, if temperature sensor 42 is formed of a dielectric material, the dielectric material surrounding temperature sensor 42 can be omitted.

A resistive foil heating system 48 includes an etched resistive foil 50 disposed within or on a surface of chuck 4. To avoid electrical contact between resistive foil 50 and chuck 4, a dielectric 52, e.g., a dielectric film, is positioned between resistive foil 50 and wafer chuck 4. In an embodiment (not shown) where resistive foil 50 is sandwiched between two or more electrically conductive layers that form chuck 4, a dielectric, e.g., a dielectric film, can be disposed on both sides of resistive foil 50 to electrically isolate resistive foil 50 from said layers. A temperature sensor 54 is positioned within or on a surface of chuck 4 for measuring the temperature of chuck 4 and, thereby, the approximate temperature of semiconductor wafer 10, especially, topside 16 of substrate 12 or topside 22 of dielectric layer 14 when present. Alternatively, temperature sensor 54 can be positioned in contact with semiconductor wafer 10, desirably topside 16 of substrate 12 or topside 22 of dielectric layer 14 when present, for measuring the temperature thereof directly.

Resistive heating element 38, temperature sensor 42, resistive foil 50 and temperature sensor 54 are connected to a temperature controller 60 which is configured to control the heat generated by resistive heating element 38 and resistive foil 50 as a function of the temperatures sensed by temperature sensors 42 and 54, respectively. More specifically, temperature controller 60 controls the electrical power and, thereby, the heat dissipated by resistive heating element 38 as a function of the temperature of contact 6 sensed by temperature sensor 42. In addition, temperature controller 60 controls the electrical power and, thereby, the heat dissipated by resistive foil 50 as a function of the temperature of chuck 4 or semiconductor wafer 10 sensed by temperature sensor 54.

The combination of temperature controller 60, resistive heating element 38 and temperature sensor 42 define a closed loop heating system for controlling the temperature of contact 6 as a function of the temperature of contact 6 and, thereby, the temperature or approximate temperature of surface 20. Similarly, the combination of temperature controller 60, resistive foil 50 and temperature sensor 54 also define a closed loop heating system for controlling the temperature of semiconductor wafer 10 as a function of the temperature of semiconductor wafer 10 or the temperature of chuck 4 and, thereby, the temperature or approximate temperature of semiconductor wafer 10.

Desirably, temperature controller 60 is operative for controlling the heat dissipated by resistive heating element 38 whereupon contact 6 is heated to a temperature sufficient to desorb at least one of water vapor and organic material from surface 20 of contact 6. Similarly, temperature controller 60 is operative for controlling the heat dissipated by resistive foil 50 whereby topside 16 of substrate 12 or topside 22 of dielectric layer 14 when present is heated to a temperature sufficient to desorb at least one of water vapor and organic material therefrom. A suitable temperature for desorbing at least one of water vapor and organic material from surface 20 of contact 6 and from topside 16 of substrate 12 or topside 22 of dielectric layer 14 when present is a temperature no less than 100 degrees centigrade (100° C.).

More specifically, the combination of temperature controller 60, resistive heating element 38 and temperature sensor 42 co-act to heat contact 6 to a temperature sufficient to desorb at least one of water vapor and organic material from surface 20 thereof. When backside 8 of semiconductor wafer 10 is positioned on chuck 4, temperature controller 60, resistive foil 50 and temperature sensor 54 co-act to heat chuck 4 and, thereby, semiconductor wafer 10, to a temperature sufficient to desorb at least one of water vapor and organic material from topside 16 of substrate 12 or topside 22 of dielectric layer 14 when present. Desirably, the temperature of surface 20 of contact 6 and the temperature of topside 16 or topside 22 when present of semiconductor wafer 10 are the same or within a predetermined temperature of each other, e.g., $\leq$ about 5 degrees centigrade, prior to contact forming means 26 moving surface 20 into contact with either topside 16 or 22 when present of semiconductor wafer 10 and during application of an electrical stimulus by means for applying electrical stimulus 30 and during measurement of the response of semiconductor wafer 10 to the applied electrical stimulus by measurement means 32.

At a suitable time, contact forming means causes surface 20 of contact 6 to press into contact with topside 16 of substrate 12 or topside 22 of dielectric layer 14 when present to form an electrical contact therewith. Desirably, at least surface 20 is formed from an elastically deformable and electrically conductive material that deforms within its elastic limits when pressed into contact with topside 16 of substrate 12 or topside 22 of dielectric layer 14 when present. Once this electrical contact has been formed, means for applying electrical stimulus 30 applies an electrical stimulus between surface 20 and semiconductor wafer 10. Measurement means 32 then measures the response of semiconductor wafer 10 to the applied electrical stimulus and determines therefrom at least one electrical property of semiconductor wafer 10.

Non-limiting examples of suitable electrical stimuli that can be applied by means for applying electrical stimulus 30 that measurement means 32 can measure include a capacitance-voltage (CV) type stimulus, a conductance-voltage (GV) type stimulus, a charge-voltage (QV) type stimulus, a current-voltage (IV) type stimulus and/or a capacitive-time (Ct) type stimulus. Non-limiting examples of electrical properties that can be determined from the electrical stimuli include flat-band voltage ($V_{FB}$), threshold voltage ($V_T$) and leakage current ($I_{LEAK}$). Since details regarding the application of these electrical stimuli and the determination of at least one electrical property from these electrical stimuli are well known in the art, such details will not be described herein for purpose of simplicity.

To prevent the electrical power dissipated by resistive heating element 38 and/or resistive foil 50 from adversely affecting the application of the electrical stimulus to semiconductor wafer 10 and/or adversely affecting the measurement of the response of semiconductor wafer 10 to the applied electrical stimulus, temperature controller 60 is operative for terminating or suspending the dissipation of electrical power by one or both of resistive heating element 38 and resistive foil 50 during the application of the electrical stimulus and/or the measurement of the response of semiconductor wafer 10 to the applied electrical stimulus. Alternatively, if temperature sensor 60 causes DC electrical power to be dissipated by resistive heating element 38 and/or resistive foil 50, and if dissipating such DC electrical power does not affect the application of the electrical stimulus and the measurement of the response of semiconductor wafer 10 to the applied electrical stimulus, temperature controller 60 can be operative for causing DC electrical power to be supplied and, thereby, dissipated by resistive heating element 38 and/or resistive foil 50 during the application of the electrical stimulus and the measurement of the response of semiconductor wafer 10 to the applied electrical stimulus.

Figure 2:
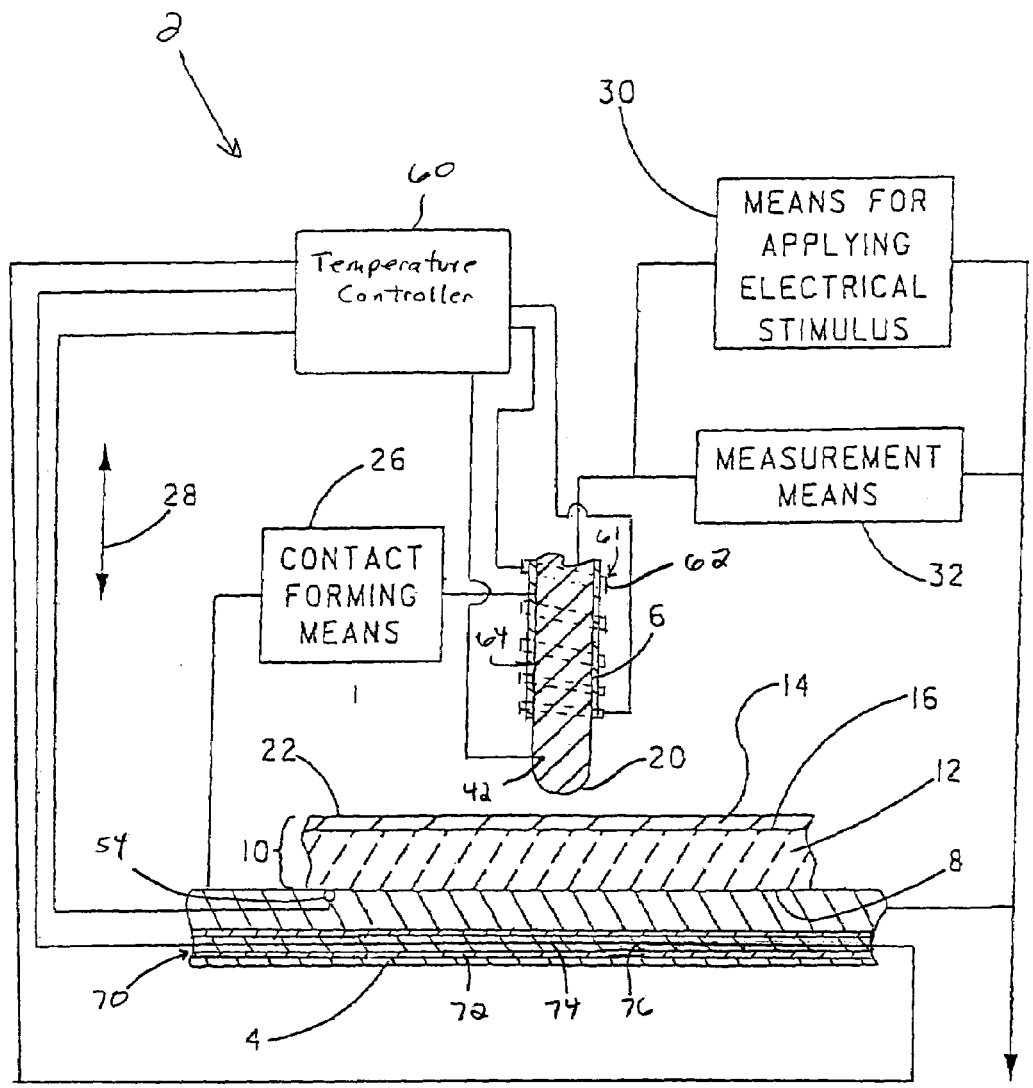

With reference to FIG. 2, and with continuing reference to FIG. 1, resistive heating system 34 can be replaced by a resistive wire heating system 61 that includes a resistive wire 62 coiled around an exterior surface of contact 6. A dielectric 64, e.g., a dielectric sleeve, can be positioned between resistive wire 62 and the outer surface of contact 6 if necessary to electrically isolate resistive wire 62 from contact 6. In this embodiment, temperature controller 60 controls the heat dissipated by resistive wire 62 as a function of a temperature of contact 6 sensed by temperature sensor 42.

Desirably, temperature controller 60 controls resistive wire heating system 61 to heat contact 6 to a temperature sufficient to desorb at least one of water vapor and organic material from surface 20 thereof as a function of the temperature sensed by temperature sensor 42.

A tubular heating system 70 can replace resistive foil heating system 48 shown in FIG. 1. Tubular heating system 70 includes a tube 72 disposed in chuck 4 in a desired pattern. A resistive wire 74 is positioned inside tube 72 and a dielectric material 76 separates resistive wire 74 from an interior surface of tube 72.

Desirably, temperature controller 60 controls tubular heating system 70 to heat chuck 4 and, thereby, semiconductor wafer 10 received on chuck 4 to a temperature sufficient to desorb at least one of water vapor and organic material from topside 16 of substrate 12 or topside 22 of dielectric layer 14 when present as a function of the temperature sensed by temperature sensor 54.

Figure 3:
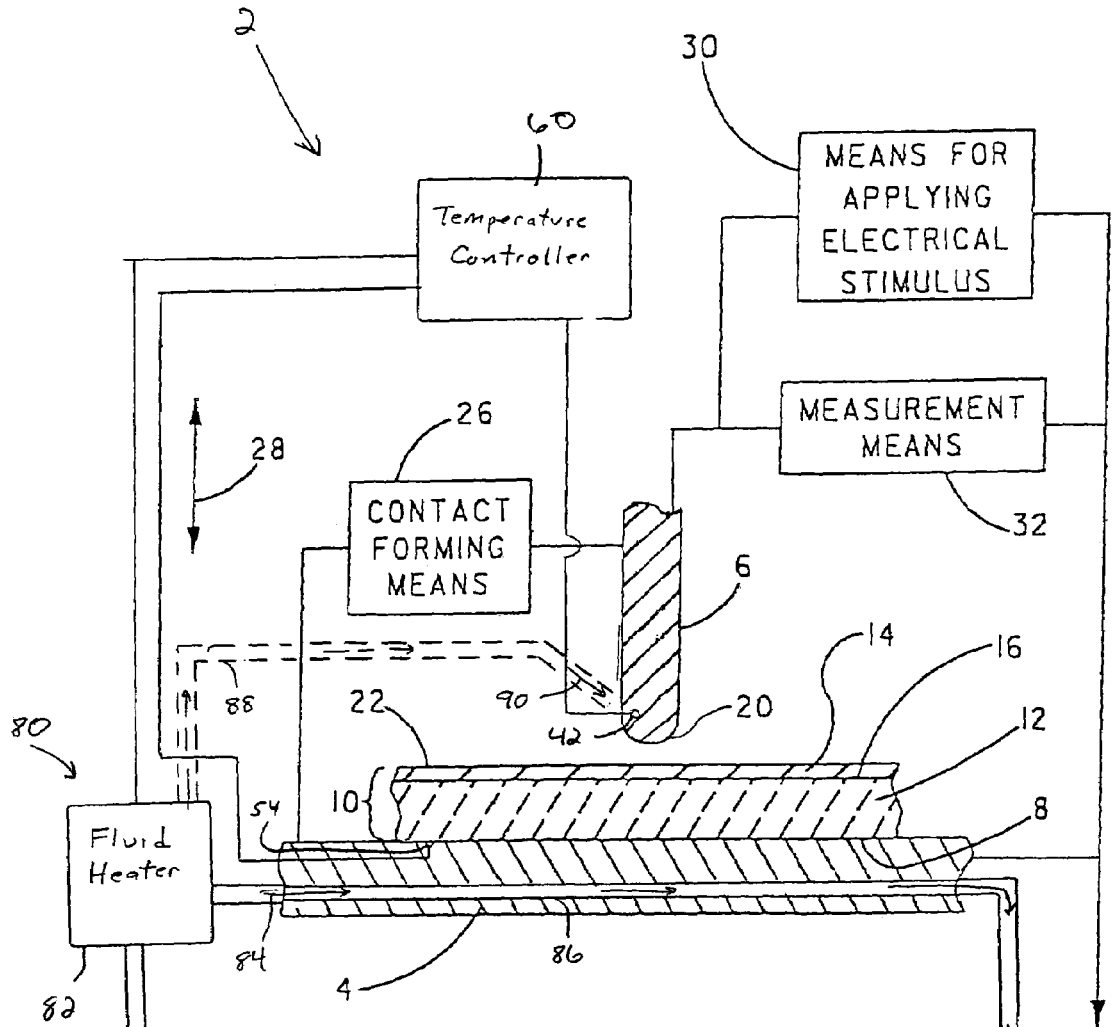

With reference to FIG. 3, and with continuing reference to FIGS. 1 and 2, resistive foil heating system 48 and/or tubular heating system 70 can be replaced by a fluid heating system 80. Fluid heating system 80 includes a fluid heater 82 operating under the control of temperature controller 60 for heating a fluid 84, such as ambient atmosphere or an inert gas, to a desired temperature. Heated fluid 84 is then passed through a tube or aperture 86 disposed in or defined in chuck 4 in a desired pattern. Fluid heating system 80 can be a closed loop heating system whereupon heated fluid exiting fluid heater 82 passes through tube 86 for return to fluid heater 82 for reuse. Alternatively, fluid heating system 80 can be an open loop heating system whereupon heated fluid 84 exiting fluid heater 82 passes through tube 86 for discharge to ambient atmosphere.

Desirably, temperature controller 60 controls fluid heating system 80 to heat chuck 4 and, thereby, semiconductor wafer 10 received on chuck 4 to a temperature sufficient to desorb at least one of water vapor and organic material from topside 16 of substrate 12 or topside 22 of dielectric layer 14 when present as a function of the temperature sensed by temperature sensor 54.

Also or alternatively, fluid heating system 80 can include a tube 88 (shown in phantom) connected between fluid heater 82 and contact 6 for supplying a flow of heated fluid 90 to contact 6, especially surface 20 of contact 6, for heating surface 20 to a temperature sufficient to desorb at least one of water vapor and organic material therefrom. Fluid heating system 80 including tube 88 connected between fluid heater 82 and contact 6 can replace resistive heating system 34 and/or resistive wire heating system 61 shown in FIGS. 1 and 2, respectively.

Temperature controller 60 controls fluid heating system 80 to heat contact 6 to a temperature sufficient to desorb at least one of water vapor and organic material from surface 20 thereof as a function of the temperature sensed by temperature sensor 42.

Figure 4:
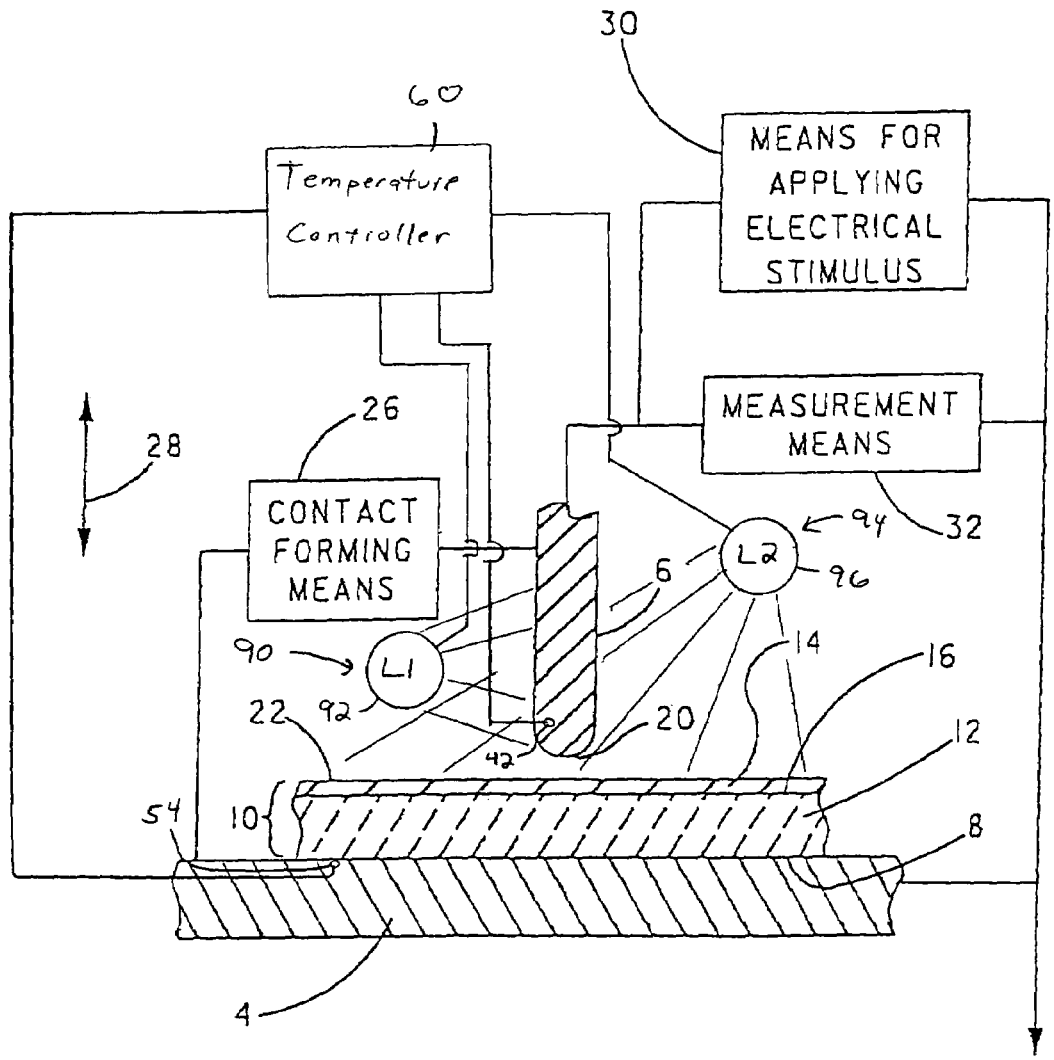

With reference to FIG. 4, and with continuing reference to FIGS. 1, 2 and 3, resistance heating system 34, resistive wire heating system 61 and/or fluid heating system 80 for heating contact 6 can be replaced by a radiant heating system 90 that includes a heat lamp 92 positioned to heat contact 6 by way of radiant energy. Desirably, temperature controller 60 controls heat lamp 92 to heat contact 6 to a temperature sufficient to desorb at least one of water vapor and organic material from surface 20 as a function of the temperature sensed by temperature sensor 42.

Resistive foil heating system 48, tubular heating system 70 and/or fluid heating system 80 for heating chuck 4 can be replaced with a radiant heating system 94 that includes a heat lamp 96 to heat semiconductor wafer 10 by way of radiant energy. Desirably, temperature controller 60 controls heat lamp 96 to heat semiconductor wafer 10 to a temperature sufficient to desorb at least one of water vapor and organic material from topside 16 of substrate 12 or topside 22 of dielectric layer 14 when present as a function of the temperature sensed by temperature sensor 54.

Any one of resistive foil heating system 48, tubular heating system 70, fluid heating system 80 for heating chuck 4 and radiant heating system 94 can be utilized in combination with any one of resistance heating system 34, resistive wire heating system 61, fluid heating system 80 for heating contact 6 and/or radiant heating system 90 as desired. Accordingly, the foregoing description of one heating system for heating contact 6 in combination with another heating system for heating chuck 4 and/or semiconductor wafer 10 is not to be construed as limiting the invention.

In the use of any combination of one of the foregoing heating systems for heating contact 6 and one of the foregoing heating systems for heating semiconductor wafer 10, electrical contact 6 is heated to a temperature sufficient to desorb at least one of water vapor and organic materials from surface 20 thereof. With the backside 8 of semiconductor wafer 10 positioned on chuck 4, chuck 4 and/or semiconductor wafer 10 is heated to a temperature sufficient to desorb at least one of water vapor and organic material from topside 16 of substrate 12 or topside 22 of dielectric layer 14 when present. Surface 20 of contact 6 is then caused to touch the topside of semiconductor wafer 10. Means for applying electrical stimulus 30 then applies an electrical stimulus between surface 20 and semiconductor wafer 10 when surface 20 of contact 6 is touching the topside of semiconductor wafer 10. Measurement means 32 then measures a response of semiconductor wafer 10 to the applied electrical stimulus and determines from the response at least one electrical property of semiconductor wafer 10.

Desirably, the heat applied to the electrical contact is controlled as a function of the temperature of the electrical contact. The heat applied to the semiconductor wafer is controlled as a function of the temperature of the semiconductor wafer itself or a temperature related to the temperature of the semiconductor wafer. For example, the temperature of chuck 4 and the temperature of semiconductor wafer 10 can be different, but the temperature of chuck 4 is related to the temperature of semiconductor wafer 10 when semiconductor wafer 10 is heated by heat conducted from chuck 4.

During application of the electrical stimulus or during measurement of the response of semiconductor wafer 10 to the electrical stimulus, temperature controller 60 can terminate or suspend the supply of electrical power to any one or combination resistive heating elements utilized to heat contact 6 or semiconductor wafer 10 to avoid the supply of electrical power from adversely affecting the application of the electrical stimulus or the measurement of the response of semiconductor wafer 10 to the applied electrical stimulus.

Desirably, surface 20 of contact 6 and the topside of semiconductor wafer 10 are at the same or at substantially the same temperature prior to surface 20 of contact 6 touching the topside of semiconductor wafer 10, and during at least one of the application of the electrical stimulus by means for applying electrical stimulus 30 and the measurement of the response of semiconductor wafer 10 to the applied electrical stimulus by measurement means 32.

The present invention has been described with reference to the preferred embodiments. Obvious modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A method of testing a semiconductor wafer comprising:
(a) heating an electrical contact to a temperature sufficient to desorb at least one of water vapor and organic material from a surface thereof;
(b) heating the semiconductor wafer to a temperature sufficient to desorb at least one of water vapor and organic material from a top surface thereof;
(c) causing the surface of the contact to touch the top surface of the semiconductor wafer;
(d) applying a CV, GV, QV, $C_t$ or IV-type electrical stimulus between the contact and the semiconductor wafer when the surface of the contact is touching the top surface of the semiconductor wafer;
(e) measuring a response of the semiconductor wafer to the electrical stimulus; and
(f) determining from the response at least one electrical property of the semiconductor wafer, wherein the temperature sufficient to desorb in step (a) and step (b) is no less than 100 degrees centigrade.

2. The method of claim 1, further including:
controlling the heat applied to the electrical contact as a function of the temperature of the electrical contact; and
controlling the heat applied to the semiconductor wafer as a function of at least one of the temperature of the semiconductor wafer and a temperature related to the temperature of the semiconductor wafer.

3. The method of claim 1, wherein step (b) includes heating a wafer chuck having a back surface of the semiconductor wafer positioned thereon.

4. The method of claim 1, wherein step (a) includes supplying an electrical current to a resistive heating element that is operative for heating the electrical contact; and
further including, terminating the supply of electrical current to the resistive heating element during at least one of step (d) and step (e).

5. The method of claim 1, wherein step (b) includes supplying an electrical current to a resistive heating element that is operative for heating the semiconductor wafer; and
further including, terminating the supply of electrical current to the resistive heating element during at least one of step (d) and step (e).

6. The method of claim 1, wherein the surface of the electrical contact and the top surface of the semiconductor wafer are either at the same temperature or within a predetermined temperature difference prior to step (c) and during at least one of step (d) and step (e).

7. A semiconductor wafer testing apparatus comprising:
a first heater for heating an electrical contact to a first temperature sufficient to desorb at least one of water vapor and organic material from a surface thereof;
a second heater for heating a top surface of the semiconductor wafer to a second temperature sufficient to desorb at least one of water vapor and organic material therefrom when the back surface of the semiconductor wafer is supported by a wafer chuck;
means for causing the surface of the electrical contact to touch the top surface of the semiconductor wafer;
means for applying a CV, GV, QV, $C_t$ or IV-type electrical stimulus between the contact and the semiconductor wafer when the surface of the contact is touching the top surface of the semiconductor wafer;
means for measuring a response of the semiconductor wafer to the applied electrical stimulus; and means for determining from the response at least one electrical property of the semiconductor wafer, wherein each temperature sufficient to desorb is no less than 100 degrees centigrade.

8. The apparatus of claim 7, further including:
a first temperature sensor for sensing the first temperature;
a second temperature sensor for sensing one of the second temperature and a temperature related thereto; and
a temperature controller for controlling the first and second heaters as a function of the temperatures sensed by the first and second temperature sensors.

9. The apparatus of claim 8, wherein the (i) first temperature and the (ii) second temperature or the temperature related thereto are one of the same temperature or within a predetermined temperature difference prior to the surface of the contact touching the top surface of the semiconductor wafer and during at least one of the application of the electrical stimulus by the means for applying the electrical stimulus and the measurement of the response of the semiconductor wafer to the electrical stimulus by the means for measuring the response of the semiconductor wafer.

10. The apparatus of claim 7, wherein:
the first heater heats the electrical contact by at least one of conduction, convection and radiation; and
the second heater heats the top surface of the semiconductor wafer by at least one of conduction, convection and radiation.

11. The apparatus of claim 7, wherein:
the first heater comprises one of a resistive heating element disposed in an aperture of the electrical contact, a resistive wire coiled around the electrical contact, a fluid heater for supplying a heated fluid to the electrical contact, and a heat lamp for heating the electrical contact; and
the second heater comprises one of a resistive foil coupled in thermal communication with the wafer chuck, a resistive wire disposed in the wafer chuck, a fluid heater for supplying a heated fluid to the wafer chuck, and a heat lamp for heating the wafer chuck.

12. The apparatus of claim 11, wherein the heated fluid is a gas.

13. The apparatus of claim 11, further including at least one of:
a dielectric disposed between the electrical contact and one of the resistive heating element and the coiled resistive wire; and
a dielectric disposed between the wafer chuck and one of the resistive foil and the resistive wire disposed in the wafer chuck.

14. A semiconductor wafer testing apparatus comprising:
means for heating an electrical contact to a temperature sufficient to desorb at least one of water vapor and organic material from a surface thereof;
means for heating the semiconductor wafer to a temperature sufficient to desorb at least one of water vapor and organic material from a top surface thereof;
means for causing the surface of the contact to touch the top surface of the semiconductor wafer;
means for applying an a CV, GV, QV, $C_t$ or IV-type electrical stimulus between the contact and the semiconductor wafer when the surface of the contact is touching the top surface of the semiconductor wafer;
means for measuring a response of the semiconductor wafer to the electrical stimulus; and means for determining from the response at least one electrical property of the semiconductor wafer, wherein each temperature sufficient to desorb is no less than 100 degrees centigrade.

15. The apparatus of claim 14, further including:
means for controlling the heat applied to the electrical contact as a function of the temperature of the electrical contact; and
means for controlling the heat applied to the semiconductor wafer as a function of at least one of the temperature of the semiconductor wafer and a temperature related to the temperature of the semiconductor wafer.

16. The apparatus of claim 14, further including means for supporting a back surface of a semiconductor wafer, wherein the means for heating the semiconductor wafer heats the means for supporting which conducts said heat to the top surface of the semiconductor wafer via the back surface thereof.

17. The apparatus of claim 14, wherein:
the means for heating the electrical contact is responsive to an electrical current supplied thereto for heating the electrical contact; and
during at least one of application of the electrical stimulus and measurement of the response of the semiconductor wafer to the electrical stimulus, the supply of the electrical current to the means for heating the electrical contact is suspended.

18. The apparatus of claim 14, wherein:
the means for heating the semiconductor wafer is responsive to an electrical current supplied thereto for heating the semiconductor wafer; and
during at least one of application of the electrical stimulus and measurement of the response of the semiconductor wafer to the electrical stimulus, the supply of the electrical current to the means for heating the semiconductor wafer is suspended.

19. The apparatus of claim 14, wherein the surface of the electrical contact and the top surface of the semiconductor wafer are either at the same temperature or within a predetermined temperature difference prior to the surface of the electrical contact touching the top surface of the semiconductor wafer and during at least one of the application of the electrical stimulus by the means for applying the electrical stimulus and the measurement of the response of the semiconductor wafer to the electrical stimulus by the means for measuring the response of the semiconductor wafer.

* * * * *

UNITED STATES PATENT AND TRADEMARK OFFICE
CERTIFICATE OF CORRECTION

PATENT NO.       : 7,304,490 B2                                    Page 1 of 1
APPLICATION NO.  : 10/982344
DATED            : December 4, 2007
INVENTOR(S)      : Howland, Jr. et al.

It is certified that error appears in the above-identified patent and that said Letters Patent is hereby corrected as shown below:

Column 10, Line 62, Claim 14, "applying an a CV," should read -- applying a CV, --

Signed and Sealed this

Second Day of September, 2008

JON W. DUDAS
*Director of the United States Patent and Trademark Office*